(12) United States Patent
Terakawa et al.

(10) Patent No.: US 7,015,774 B2
(45) Date of Patent: Mar. 21, 2006

(54) NOISE FILTER AND ELECTRONIC APPARATUS HAVING THE SAME

(75) Inventors: Takashige Terakawa, Tokyo (JP); Hideyuki Yamanaka, Tokyo (JP)

(73) Assignee: EMC Inc., Tokyo (JP)

(*) Notice: Subject to any disclaimer, the term of this patent is extended or adjusted under 35 U.S.C. 154(b) by 0 days.

(21) Appl. No.: 10/731,021

(22) Filed: Dec. 10, 2003

(65) Prior Publication Data

US 2004/0263284 A1     Dec. 30, 2004

(30) Foreign Application Priority Data

Jun. 26, 2003   (JP)   ............... 2003-183302

(51) Int. Cl.
*H03H 7/06* (2006.01)
(52) U.S. Cl. ............... 333/181; 333/172; 333/174
(58) Field of Classification Search ............... 333/167, 333/172, 174, 181, 185, 12
See application file for complete search history.

(56) References Cited

U.S. PATENT DOCUMENTS

| | | | |
|---|---|---|---|
| 1,921,830 A | | 8/1933 | Krambeer |
| 4,918,591 A | * | 4/1990 | Link ........................... 333/167 |
| 5,015,975 A | | 5/1991 | Okubo |
| 5,036,292 A | * | 7/1991 | Hjelm et al. ................ 333/181 |
| 5,739,732 A | | 4/1998 | Kit |
| 5,805,042 A | * | 9/1998 | Chastain et al. ............ 336/170 |
| 6,075,425 A | * | 6/2000 | Gopfrich et al. ........... 333/181 |
| 6,121,857 A | * | 9/2000 | Huang ........................ 333/172 |
| 6,137,379 A | * | 10/2000 | Morrill ....................... 333/169 |
| 6,160,461 A | | 12/2000 | Azuma et al. |
| 6,801,103 B1 | * | 10/2004 | Terakawa et al. ........... 333/181 |
| 2003/0117814 A1 | | 6/2003 | Terakawa et al. |

FOREIGN PATENT DOCUMENTS

| | | | |
|---|---|---|---|
| EP | 1 492 230 A1 | | 12/2004 |
| JP | 51-91642 | | 8/1976 |
| JP | 59172822 A | * | 9/1984 |
| JP | 61-140620 | | 6/1986 |
| JP | 01-316012 | | 12/1989 |
| JP | 06-233521 | | 8/1994 |
| JP | 08265085 A | * | 10/1996 |
| JP | 09-214276 | | 8/1997 |

OTHER PUBLICATIONS

European Search Report, dated Jan. 3, 2005.
Chinese Office Action dated Feb. 1, 2005 (with partial English translation).
European Search Report dated Nov. 3, 2004.

* cited by examiner

*Primary Examiner*—Seungsook Ham
(74) *Attorney, Agent, or Firm*—McGinn IP Law Group, PLLC (57) ABSTRACT

A noise filter of the present invention includes an inductor and a resistor connected in parallel with each other. A power supply frequency current does not pass the resistor but passes through the inductor with no loss. On the other hand, a high frequency noise current including a resonance frequency current, does not pass the inductor but is dissipated at the resistor. Therefore, the noise filter does not charge noise power and so does not suffer from a problem due to power discharging. The resonance frequency current caused by the noise filter and the earth capacitance is also dissipated at the resistor. Therefore, no problem is caused by the resonance frequency current.

18 Claims, 10 Drawing Sheets

PRIOR ART

NOISE FILTER AND ELECTRONIC APPARATUS HAVING THE SAME

BACKGROUND OF THE INVENTION

1. Field of the Invention

The present invention relates to a noise filter provided to a ground line for discharging a short-circuit current generated on an electronic apparatus to the ground, and in detail, to a noise filter having an inductor which suppresses noise induced on the ground line.

2. Description of the Related Art

A conventional noise filter of this type comprises an inductor, having a function to discriminate a frequency of an undesired signal called "noise" from others to thereby pass a short-circuit current from the commercial power supply to the ground (for example, see the Japanese Utility Model Laid-open No. 61-140620 (FIG. 1, etc.)). The noise has a frequency of, for example, 10 kHz or higher. The commercial power supply has a frequency of 50 Hz or 60 Hz in Japan.

Figure 10:
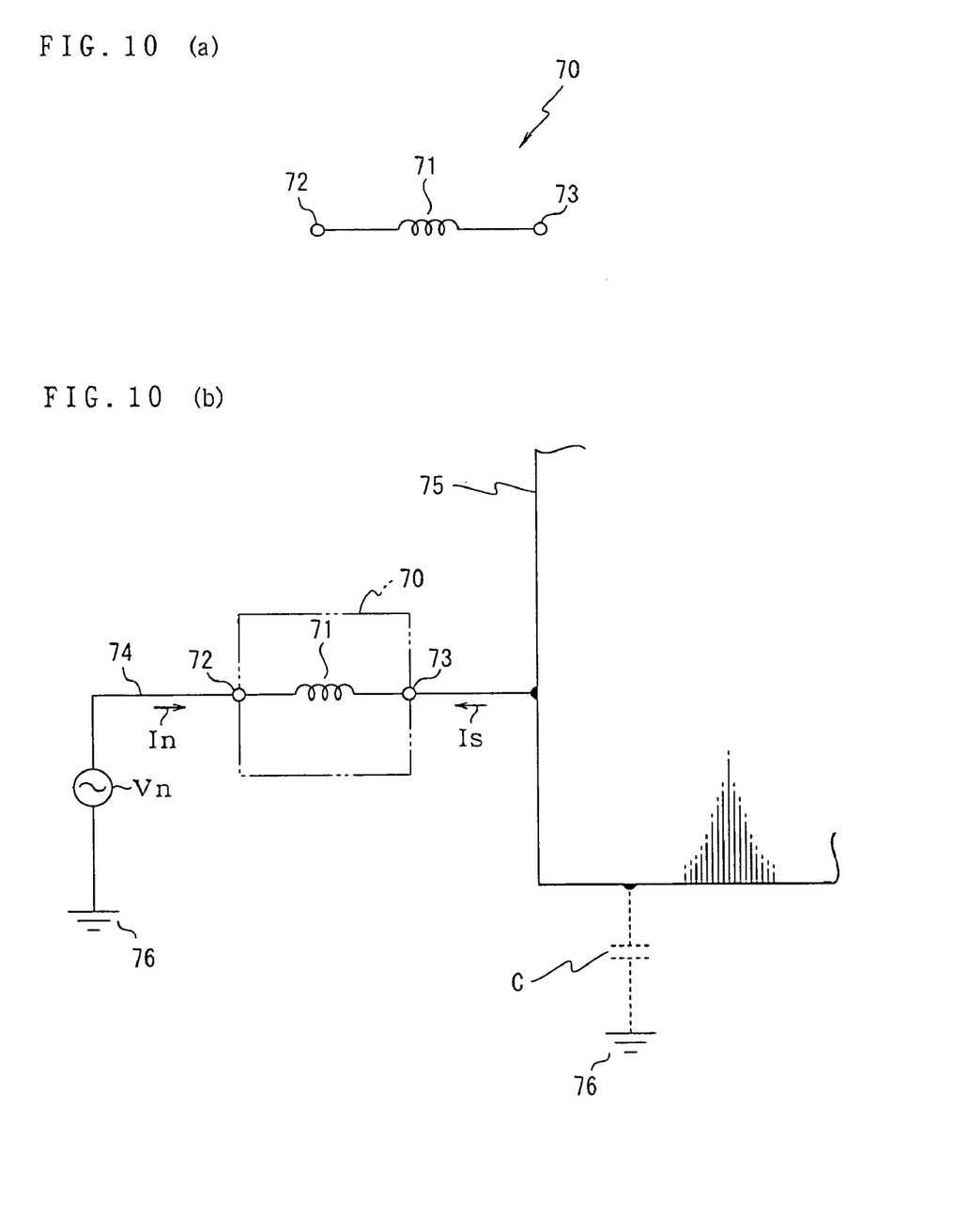
FIG. 10(a) is a circuit diagram showing a conventional noise filter.
FIG. 10(b) is a circuit diagram showing a state where the noise filter of FIG. 10(a) is used.

FIG. 10(a) is a circuit diagram showing a conventional noise filter. FIG. 10(b) is a circuit diagram showing a state where the noise filter shown in FIG. 10(a) is used. The following will describe the noise filter with reference to these Figures.

A noise filter 70 is a two-terminal type noise filter for use on a ground line, comprising one inductor 71. One terminal 72 is grounded through a ground line 74 and the other terminal 73 connects to an electronic apparatus 75. Further, inductance of the inductor 71 is so set that a short-circuit current Is of the commercial power supply caused by a leakage or the like is passed from the electronic apparatus 75 to the ground 76, and also a noise current In induced on the ground line 74 may be blocked.

However, the conventional noise filters have the following problems.

(1) A noise power referred to as "noise" is induced not only in a steady-state current on the ground line 74 but also in a pulse-state current with non-periodically. In such a case, the inductor 71 constituting the noise filter 70, which charges power thereon owing to magnetic and electric fields, discharges the charged power when noise power stops flowing thereto. As such, this discharged power may cause the electronic apparatus 75 to fail or temporarily deteriorate in functioning.

(2) In order to reduce the noise current In induced on the ground line 74, the inductor 71 is effective as described above. On the other hand, large electronic apparatuses, among the electronic apparatuses 75 connected to the ground line 74, have considerably large earth capacitance C, which may sometimes be combined with the inductor 71 to give rise to series resonance. When the resultant resonance frequency current flows on the electronic apparatus 75, a failure due to noise arises.

(3) It is preferable that the inductance of the inductor 71 be as high as possible in order to block the noise current In, but that the inductance be as low as possible in order to conduct the short-circuit current Is. It has been considerably difficult to do a balancing act between these contradicting characteristics. That is, when the inductance is increased in order to fully block the noise current In, the short-circuit current Is is not well conducted, and when the inductance is decreased in order to well conduct the short-circuit current Is, the noise current cannot be fully blocked.

SUMMARY OF THE INVENTION

It is therefore an object of the present invention to provide a noise filter which is capable of solving problems of: power discharged therefrom, a resonance frequency current caused by a combination of the noise filter and the earth capacitance, and a balancing act between blocking of the noise current and conducting of the short-circuit current, and also to provide an electronic apparatus using the noise filter.

The present inventor greatly engaged in researches to solve these problems and found that "a problem due to power discharged from a noise filter occurs if the noise filter does not have a function to dissipate a noise current (transform it into thermal energy) "and" a balancing act between blocking of a noise current and conducting of a short-circuit current can be achieved by using a magnetic saturation effect of the inductance". The present invention has been developed based on these findings. That is, by connecting a resistor of the noise filter in parallel with the inductor, the noise current is dissipated at the resistor. It is also found that in such a circuit configuration, the resistor acts also to attenuate a series resonance current generated by a combination of the earth capacitance and the inductor. Further, with an inductor which is magnetically saturated by a short-circuit current, the impedance is lowered irrespective of the inductance against the short-circuit current. Thereby, it is possible to fully block the noise current by increasing the inductance. The details will be explained below.

The noise filter according to the present invention is attached to a ground line for discharging a short-circuit current generated on an electronic apparatus, and is provided with an inductor for suppressing a noise current induced on the ground line and a resistor connected in parallel with the inductor. Here, assuming a lower limit angular frequency of the noise current to be $\omega n[rad]$, inductance of the inductor to be $L[H]$, resistance of the resistor to be $R[\Omega]$, and earth capacitance of the electronic apparatus is $C[F]$, a relationship of $\sqrt{(L/C)} < R < 2\omega n^2 L$ (provided $C > 1/(4\omega n^4 L)$) is established.

A current having low frequency such as power supply frequency, that is, a short-circuit current, passes through the inductor with low impedance against the low frequency current while not passing the resistor. On the other hand, high frequency noise current including the resonance frequency current does not pass the inductor but is dissipated in the resistor. Accordingly, since electric power caused by the noise is not charged in the noise filter, the problem caused by discharging of the electric power does not occur. Further, since the resonance frequency current caused by the noise filter and the earth capacitance is also dissipated in the resistor, the problem caused by the resonance frequency current does not occur.

The smaller the resistance of the resistor is, the more resonance frequency currents can be suppressed and a current discharged from the inductor connected in parallel is easily dissipated. However, if the resistance of the resistor is small, a high frequency noise current cannot be suppressed. Here, assuming $\sqrt{(L/C)} > R$, no series resonance of the inductor and the earth capacitance is generated, but at the same time, a high frequency noise current cannot be suppressed. Therefore, setting the left side as $\sqrt{(L/C)} < R$. However, assuming $\sqrt{(L/C)} << R$, the series resonance current of the inductor and the earth capacitance cannot be disregarded. Therefore, setting the right side as $R < 2\omega n^2 L$. By satisfying the condition of the right side, the current dissipated at the resistor exceeds the current charged on the inductor, so that a characteristic having a high capability of dissipating a noise current can be obtained.

Further, the noise filter according to the present invention is of a type which is attached to a ground line of an electronic apparatus using a commercial power supply, and comprises: an inductor having a characteristic of suppressing a noise current induced on the ground line and being magnetically saturated by a short-circuit current based on the commercial power supply, and a resistor connected in parallel with the inductor.

When a failure of short-circuit or the like arises on the electronic apparatus, the short-circuit current flows to the ground through the noise filter. At this time, since the inductor of the noise filter is magnetically saturated, the short-circuit current passes through the inductor with almost no loss. On the other hand, a high frequency noise current including a resonance frequency current does not pass the inductor but is dissipated at the resistor. Therefore, power of the noise is not charged in the noise filter, so that a problem due to the discharged power does not arise. Further, a resonance frequency current caused by the noise filter and the earth capacitance is also dissipated in the resistor, so that a problem due to the resonant frequency current does not arise. Further, since the inductor is magnetically saturated by the short-circuit current based on the commercial power supply, the short-circuit current passes the inductor with almost no loss even though the inductance of the inductor is increased. As such, it is possible not only to further suppress the high frequency noise current but also to suppress the low frequency noise current such as a power supply frequency.

Assuming an angular frequency of a power supply current to be $\omega p$[rad], a lower limit angular frequency of the noise current to be $\omega n$[rad], inductance of the inductor to be L[H] and resistance of the resistor to be R[$\Omega$], it is preferable that a relationship of $10(\omega p \cdot L) < R < (\omega n \cdot L)/10$ be established. More preferably, a relationship of $100(\omega p \cdot L) < R < (\omega n \cdot L)/100$ be established, and most preferably, a relationship of $1000(\omega p \cdot L) < R < (\omega n \cdot L)/1000$ be established. By narrowing the range of the value of R in this way, it is possible to obtain well balanced characteristics that an attenuation quantity at $\omega p$ is adequately small and that at $\omega n$ is adequately large. In other words, by narrowing the range of the value of R in this way, it is possible to obtain characteristics by which the noise filter can operate as an inductor at $\omega p$ and operate as a resistor at $\omega n$.

The parallel circuit consisting of the inductor and the resistor may be configured that one terminal is grounded through the ground line and the other terminal connects to the electronic apparatus. The number of inductors and resistors may be single or plural. When there are a plurality of inductors, a configuration of at least one inductor being connected in parallel with the resister may be acceptable.

When the short-circuit current is 25 [A], the impedance of the noise filter may be 0.1[$\Omega$] or less. This is a characteristic conforming to the IEC standard. When the frequency of the noise current is 10 [kHz], the reactance of the inductor may be 2 [k$\Omega$] or more. If there is a reactance of 2 [k$\Omega$] or more against the noise frequency of 10 [kHz] or more, the capacity is enough as a noise filter.

Also, a resistor may be a variable resistor. Depending on electronic apparatuses to which the noise filter is attached, earth capacitance fluctuates. Even in this case, it is possible to accommodate properly to the fluctuation of the resonance frequency by changing the resistance of the variable resistor. In other words, the noise filter of the present invention is one which is attached to a ground line of apparatuses having different earth capacitance respectively, and comprises, an inductor for suppressing noise induced on the ground line, and a variable resistor connected in parallel with the inductor. The variable resistor can be adjusted so as to have resistance which suppresses the resonance frequency current caused by the inductor and the earth capacitance in the state that the noise filter is attached to the ground line. It should be noted that the "variable resistor" described herein includes a series circuit consisting of a fixed resistor and a variable resistor, a so-called semi-fixed resistor, a circuit consisting of a plurality of fixed resistors having different resistance and a switch for selecting one of these resistors, and the like.

The noise filter may have a configuration that the inductor is a toroidal coil, a parallel circuit consisting of the toroidal coil and the variable resistor is housed in a frame, the variable resistor is arranged in a space surrounded by the inner peripheral wall of the toroidal coil, and a resistance varying means for varying resistance of the variable resistor is provided at such a position as to be able to be operated from the outside of the frame.

By operating the resistance varying means from the outside of the frame, fluctuations in value of the earth capacitance can be easily accommodated. Further, since the variable resistor is arranged in the space surrounded by the inner peripheral wall of the toroidal coil, the space in the frame can be utilized effectively.

An electronic apparatus of the present invention is one provided with any one of the noise filters described above.

The noise filter of the present invention has such a simple configuration that an inductor of the conventional noise filter and a resistor are connected in parallel with each other, so that a high frequency noise current including a resonance frequency current does not pass the inductor and is dissipated at the resistor, thus making it possible to prevent the electronic apparatus from malfunctioning due to power discharging and also suppress a resonance frequency current due to the earth capacitance of the electronic device.

The noise filter of the present invention is, assuming the lower limit angular frequency of the noise current to be Wn, the inductance of the inductor to be L, the resistance of the resistor to be R, and earth capacitance of the electronic apparatus to be C, so set that a relationship of $\sqrt{(L/C)} < R < 2\omega n^2 L$ is established. Thereby, characteristics, in which the suppression of the resonance frequency current and the suppression of the noise current with high frequency are balanced, can be obtained, and also characteristics having a high performance in dissipating the noise current can be obtained.

According to the noise filter of the present invention, since the inductor is magnetically saturated by the short-circuit current generated on the electronic apparatus, the impedance is lowered against the short-circuit current irrespective of the inductance, so that the inductance can be fully increased. Thereby, not only the noise current with high frequency but also that with low frequency can be well suppressed.

Further, in the noise filter according to the present invention, assuming an angular frequency of a power supply current to be $\omega p$, a lower limit angular frequency of the noise current to be $\omega n$, inductance of the inductor to be L, and resistance of the resistor to be R, it is preferable that a relationship of $10(\omega p \cdot L) < R < (\omega n \cdot L)/10$ be established, and more preferably, $100(\omega p \cdot L) < R < (\omega n\ L)/100$ be established, and most preferably, $1000(\omega p \cdot L) < R < (\omega n \cdot L)/1000$ be established. Accordingly, it is possible to obtain balanced characteristics that an attenuation quantity at $\omega p$ is adequately small and that at $\omega n$ is adequately large, that is, characteristics by which the noise filter is surely operable as an inductor at ωp and as a resistor at ωn.

Further, the noise filter according to the present invention is so configured that a parallel circuit consisting of the inductor and the resistor is attached to one ground line, in which one terminal is grounded and the other terminal connects to the electronic apparatus. Therefore, it can be used as a noise filter for a ground line.

Further, according to the noise filter of the present invention, when the short-circuit current is 25 [A], the impedance of the noise filter is 0.1[Ω] or less, so that the noise filter conforms to the IEC standard.

Further, the noise filter of the present invention has the reactance of 2 [kΩ] or more against the noise frequency of 10 [kHz] or more, so that the noise current can be well suppressed.

Further, according to the noise filter of the present invention, the resistor connected in parallel with the inductor may be a variable resistor. Therefore, even when the value of the earth capacitance fluctuates depending on the electronic apparatuses, the fluctuation in resonance frequency can be accommodated properly by changing the resistance of the variable resistors. That is, by adjusting the resistance of the variable resistor corresponding to the earth capacitance of the apparatus after the noise filter is attached to the ground line of the apparatus, the resonance frequency current caused by the inductor of the noise filter and the earth capacitance of the apparatus can be suppressed. Further, when the earth capacitance of the apparatus varies by moving the apparatus to other place or arranging another apparatus in the periphery of the apparatus, the resonance frequency current can be suppressed by adjusting the resistance of the variable resistor.

Further, the noise filter of the present invention has a configuration that a resistance varying means for varying resistance of the variable resistor is provided at such a position as to be able to be operated from the outside of the frame. Accordingly, by operating the resistance varying means from the outside of the frame, fluctuations in value of the earth capacitance can also be easily accommodated. Further, the variable resistor is arranged in a space surrounded by an inner peripheral wall of the toroidal coil, thus the space in the frame can be utilized effectively. Accordingly, miniaturization and lightening of the noise filter can be achieved.

PREFERRED EMBODIMENTS OF THE INVENTION

FIG. 1(a) is a circuit diagram showing a first embodiment of a noise filter according to the present invention, and FIG. 1(b) is a circuit diagram showing a state where the noise filter of FIG. 1(a) is used. The following will describe the present invention with reference to these Figures. The same components in these Figures as those in FIG. 10(a) are indicated by the same reference numerals and their explanations are omitted.

A noise filter 10 of this embodiment comprises an inductor 12 and a resistor 11 connected in parallel with each other. The parallel circuit consisting of the inductor 12 and the resistor 11 has one terminal 72 grounded through a ground line 74 and the other terminal 73 connected to an electronic apparatus 75. As such, the noise filter 10 is of a 2-terminal type for use on a ground line.

When a failure such as a short-circuit arises on the electronic apparatus 75, the short-circuit current Is flows to the ground 76 through the noise filter 10. At this time, the inductor 12 of the noise filter 10 is magnetically saturated, so that the short-circuit current Is passes through the inductor 12 with almost no loss. On the other hand, a high-frequency noise current In including a resonance frequency current does not pass the inductor 12 and is dissipated at the resistor 11. Therefore, the noise filter 10 does not charge noise power and so has no problem caused by discharging of power. Further, a resonance frequency current caused by the noise filter 10 and the earth capacitance C is also dissipated at the resistor 11, thus no problem is caused by the resonance frequency current.

Now, assuming inductance of the inductor 12 to be L and an angular frequency to be ω, the reactance is ωL. On the other hand, the reactance due to the earth capacitance C of the electronic apparatus 75 is 1/ωC, which resonates to ωL in series, thus generating a noise current.

In this embodiment, the inductor 12 is connected in parallel with the resistor 11. Therefore, a low-frequency and small current such as a slight leakage current of the commercial power supply passes through the inductor 12 with low reactance, while a noise current In having a higher frequency component passes through the resistor 11 to have the power dissipated.

That is, assuming resistance of the resistor 11 to be R, impedance Z of the noise filter 10 is given as follows:

$$Z=[1/\{R^2+(\omega L)^2\}]\cdot\{R(\omega L)^2+jR^2(\omega L)\} \quad (1)$$

If ωL<<R, $$Z=[1/\{1+(\omega L)^2\}]\cdot\{(\omega L)^2/R+j\omega L\}\approx j\omega L \quad (2)$$

If ΩL>>R, $$Z=[1/\{1+(\omega L)^2\}]\cdot\{R+jR(R/\omega L)\}\approx R \quad (2)$$

As is clear from the equation (2), in a case of ω being small, that is a case of low frequency current (power supply current), the impedance of the noise filter 10 is Z≈jωL, so that it passes through the noise filter 10 with a little loss. On the other hand, in a case of ω being large, that is a case of high frequency current (noise current) including a resonance frequency, it is dissipated at the noise filter 10 since its impedance is Z≈R, as is clear from the equation (3).

Assuming an angular frequency of the power supply current to be ωp[rad], a lower limit angular frequency of the noise current to be ωn[rad], inductance of the inductor 12 to be L[H], and resistance of the resistor 11 to be R[Ω] the following relationship must be satisfied as is clear from the equations (2) and (3):

$$(\omega p \cdot L) << R << (\omega n \cdot L) \tag{4}$$

As for a relationship of (ωp·L)<<<R, which is on the left side of the formula, R should preferably be larger than (ωp·L) as much as possible. As for a relationship of R<<(ωn·L), on the right side of the formula, R should preferably be smaller than (ωn·L) as much as possible. In order to trade off these two relationships, preferably, for example, the following relationship be established:

$$10(\omega p \cdot L) < R < (\omega n \cdot L)/10 \tag{5}$$

More preferably, the following formula be established:

$$100(\omega p \cdot L) < R < (\omega n \cdot L)/100 \tag{6}$$

Most preferably, the following formula be established:

$$1000(\omega p \cdot L) < R < (\omega n \cdot L)/1000 \tag{7}$$

By narrowing the range of the value of R in this way, it is possible to obtain balanced characteristics that an attenuation quantity at ωp is adequately small and that at ωn is adequately large. In other words, as the range of R being narrowed as much as possible, characteristics by which the noise filter is surely operable as an inductor at ωp, and as a resistor at ωn can be obtained.

The following will further describe an appropriate relationship among ωn, L, and R with reference to FIG. 1(b).

A noise current In due to a noise power supply voltage Vn flows through the ground line 74 to the electronic apparatus 75, thus giving rise to a failure in the electronic apparatus 75. This failure of electronic apparatus 75 can be prevented by the noise filter 10, which transforms a part of the noise current In into heat at the resistor 11. If the failure of the electronic apparatus 75 is not significant in degree, the failure may sometimes be recovered only by dissipating a little part of the noise current In at the resistor 11. Therefore, basically the value of R is not limited.

Here, assuming a voltage across the noise filter 10 to be Vf, a current flowing through the inductor 12 to be Il, and a current flowing through the resistor 11 to be Ir, the following equations are given:

$$Il = Vf/(\omega n \cdot L) \tag{8}$$

$$Ir = Vf/R \tag{9}$$

As such, a power Wl charged in the inductor 12 is given by:

$$Wl = L \cdot Il^2/2 = Vf^2/(2\omega n^2 L) \tag{10}$$

Then, power Pr dissipated at the resistor 11 is given by:

$$Pr = Ir^2 \cdot R = Vf^2/R \tag{11}$$

In this case, it is preferable that the power Pr dissipated at the resistor 11 exceed at least the power Wl charged in the inductor 12, that is Pr≧Wl. Needless to say, the reason is that the larger the power Pr dissipated at the resistor 11 is, the more noise current is suppressed. Therefore, the following equation is established from the equations (10) and (11):

$$Wl/Pr = R/(2\omega n^2 \cdot L) \leq 1 \tag{12}$$

$$\therefore (\omega n \cdot L)/R \geq 1/(2\omega n) \tag{13}$$

Assuming that L=3 [mH] and ωn=2π×100 [rad], for example. The parameter ωn represents a second harmonic of a commercial power supply with a frequency of 50 [Hz]. In this case, the following equation is given from the equation (13):

$$(2\pi \times 100 \times 0.003)/R = 0.6\pi/R \geq 1/(4\pi \times 100)$$

$$\therefore R \leq 240\pi^2 \approx 2.37 \text{ [k}\Omega\text{]} \tag{14}$$

That is, the noise filter 10 having the resistor 11 with a value of R that satisfies the equation (14) can essentially cut off the noise which is not lower in frequency than the second harmonic of the power supply frequency.

Next, the inductor 12 will be described in detail based on the specific values.

The inductor 12 is so formed that, for example, a ferrite toroidal core having the outer diameter of 90 mm, the inner diameter of 74 mm, and the thickness of 13.5 mm, is coiled with a copper wire having the diameter of 2 mm for 100 turns. In this case, the inductance of the inductor 12 is 32 mH, so that the reactance against the noise current In of 10 kHz is to be 2 kΩ. Thereby, an effect of significant noise current being suppressed can be expected.

On the other hand, the IEC standard and the UL standard define that impedance of a circuit element to be inserted into a ground line 74 must be 0.1Ω or less in the state of commercial frequency current of 25 A being conducted for 60 seconds. The reactance of the inductor 12, against a commercial power supply frequency of 60 Hz, is to be 12Ω if it is calculated using the inductance of 32 mmH, which dose not conform to the standards. Practically, however, the impedance of the inductor 12 is to be 0.1Ω or less, so as to conform to the standards. This is because that the ferrite toroidal core comes into a saturation region in the B-H characteristics against the current value of 25 A, thereby the inductor 12 looses the function as an inductor so as to be a circuit element only with a conduct line resistance.

That is to say, the noise filter 10 is a noise filter for a ground line, which actively utilizes saturation characteristics of a magnetic material. The ground line 74 has a reference potential function for setting the reference potential of the electronic apparatus 75 and a short-circuit protective function working as a short-circuit current path (so-called safety ground line) when a failure of short-circuit occurs on the electronic apparatus 75. The reference potential function is a function which identifies the reference potential of the power supply side and the reference potential of the apparatus to which the power is supplied, and is not intended to flow a current. On the other hand, the short-circuit protective function is intended to suppress to the minimum a burnout damage caused by a failure of short-circuit on the side of apparatus to which the power is supplied, and to protect a human body contacting the frame of the apparatus. Accordingly, it is assumed that a large volume of current is to be conducted in the short-circuit protective function. Therefore, rigid standards such as aforementioned are provided.

Figure 1:
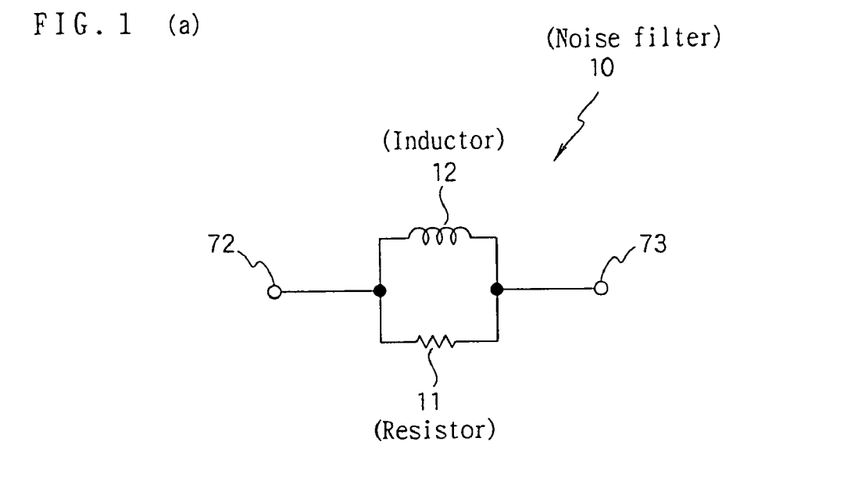
FIG. 1(a) is a circuit diagram showing a first embodiment of a noise filter according to the present invention.
FIG. 1(b) is a circuit diagram showing a state where the noise filter of FIG. 1(a) is used.
Figure 2:
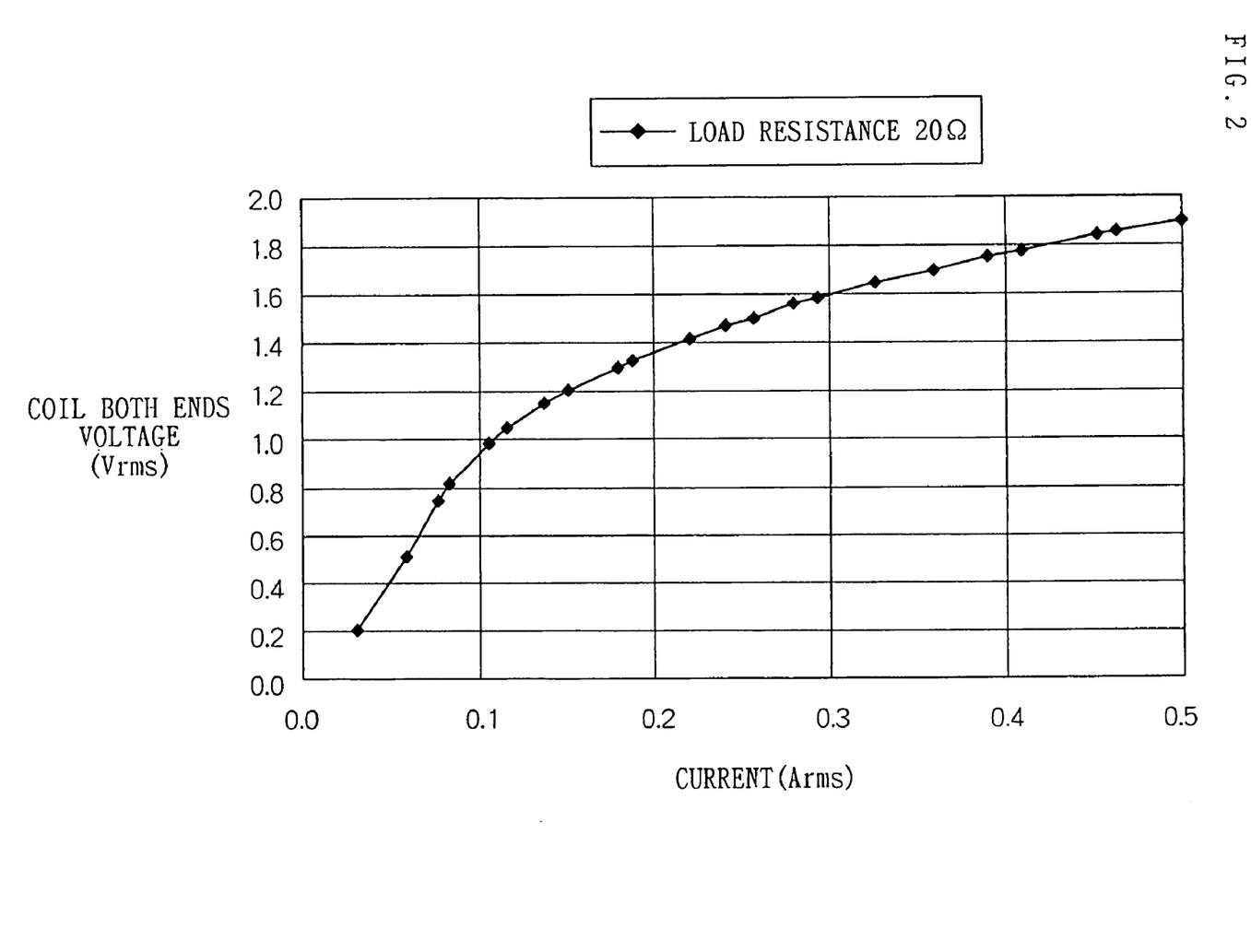
FIG. 2 is a graph showing an example of current-voltage characteristics (No. 1) of the inductor in the noise filter of FIG. 1(a)
Figure 3:
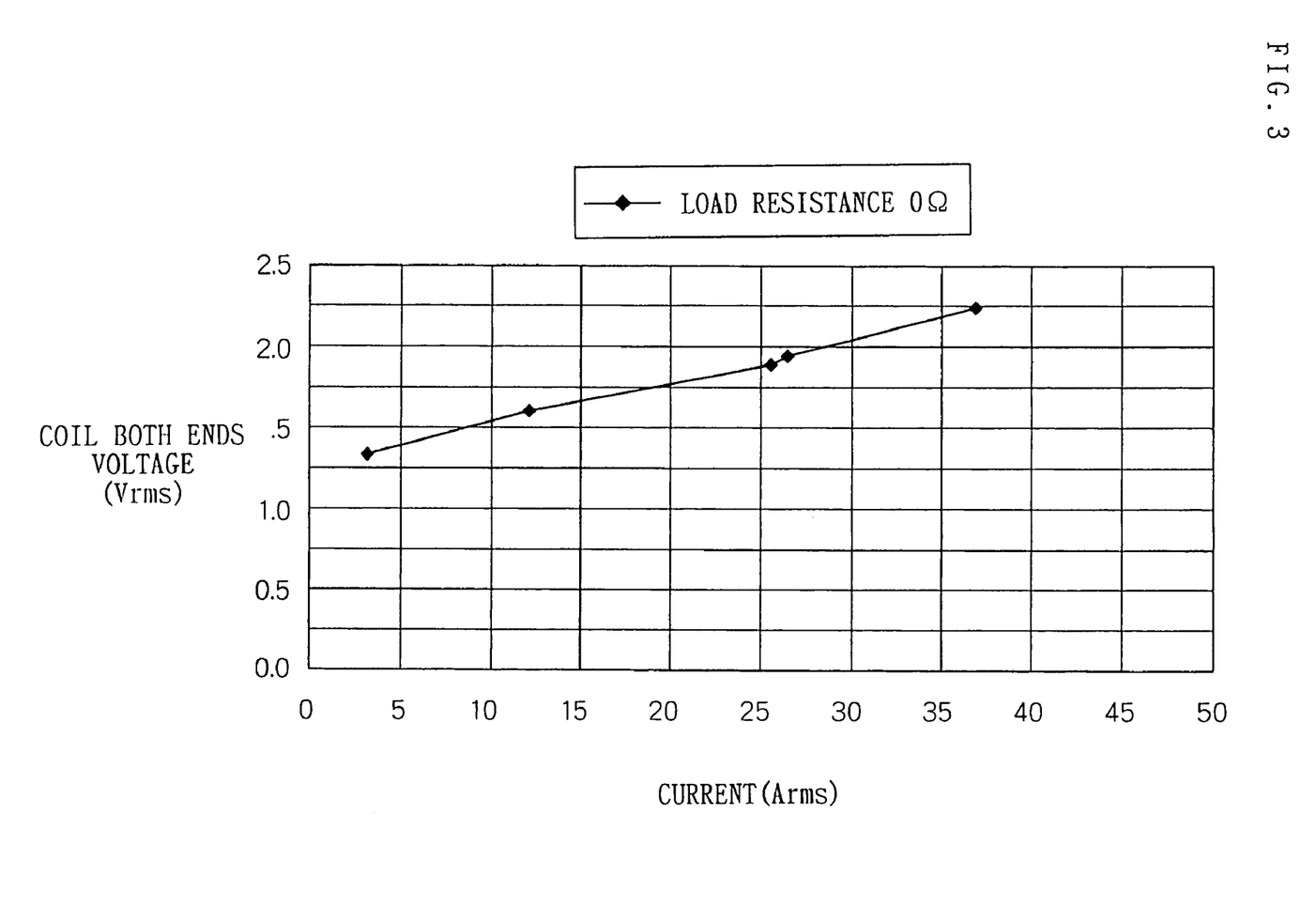
FIG. 3 is a graph showing an example of current-voltage characteristics (No. 2) of the inductor in the noise filter of FIG. 1(a)

FIG. 2 and FIG. 3 are graphs showing examples of current-voltage characteristics of the inductor 12. Descriptions will be made below with reference to FIGS. 1(a) 1(b), 2 and 3.

FIGS. 2 and 3 show current values and voltage values between the indictor terminals which are plotted, when the inductor 12 is in series connection with a current limit resistor of 20Ω and the current of commercial power supply frequency of 50 Hz is conducted. As obvious from FIG. 2, when the current value exceeds 80 mA, linearity in the current-voltage relationship is lost, and the core material comes into the saturation region. As obvious from FIG. 3, the reactance value at the point where a current of 25 A is flown is read as 0.072Ω, which satisfies the aforementioned standards. On the other hand, there may be no case at all that the noise current In induced on the ground line 74 exceeds 80 mA. Since there is no case that the inductor 12 is magnetically saturated by the noise current In, the inductor 12 is expected to provide significant effects as a filter for blocking a noise current including the commercial power supply frequency. That is to say, the inductor 12 is magnetically saturated by the short-circuit current Is based on the commercial power supply (large current). Therefore, even though the inductance L of the inductor 12 is increased, the short-circuit current Is passes through the inductor 12 with almost no loss. As a result, it is possible not only to further suppress a high frequency noise current In, but also suppress a low frequency noise current In (small current).

Next, the necessity of the resistor 11 which is connected in parallel with the inductor 12 will be described.

As well known, an indicating symbol of a coiled inductor as a circuit element is inductance L. However, more strictly, it is indicated by a compounded two-terminal circuit in which a series two-terminal circuit consisting of resistance R and inductance L connects to a parallel capacitance C'. Here, the resistance R shows a magnetism loss when a magnetic material such as ferrite or silicon steel is used as a core material, and the parallel capacitance C' shows a stray capacitance generated between coil wires. Therefore, when the inductor 12 is used as a circuit element, there is generated a parallel resonance of L and C'. That is, the impedance |Z| of the circuit element is given as follows, provided that the resonance angular frequency ω is ω=1/√(LC'):

$$|Z|=\sqrt{\{R^2+(\omega L)^2\}}/\sqrt{\{(1-\omega^2 LC')^2+(\omega RC')^2\}} \quad (15)$$

Here, the maximum value of |Z| is given as follows:

$$|Z|=\sqrt{\{R^2+(\omega L)^2\}}/R\omega C' \quad (16)$$

Further, against each frequency showing such a high value as $1 \ll \omega^2 LC'$, |Z| is given as follows:

$$|Z| \approx \sqrt{\{R^2+(\omega L)^2\}}/\sqrt{\{(\omega^2 LC')^2+(\omega RC')^2\}} \quad (17)$$
$$= \sqrt{\{R^2+(\omega L)^2\}}/[\omega C'\sqrt{\{R^2+(\omega L)^2\}}]$$
$$= 1/\omega C'$$

Therefore, this circuit element is to be an element only with a stray capacitance. Further, as the number of turns of the coiled wires is increased so as to gain larger inductance, the stray capacitance is also increased, so that the angular frequency acting as an inductor is lowered.

Figure 4:
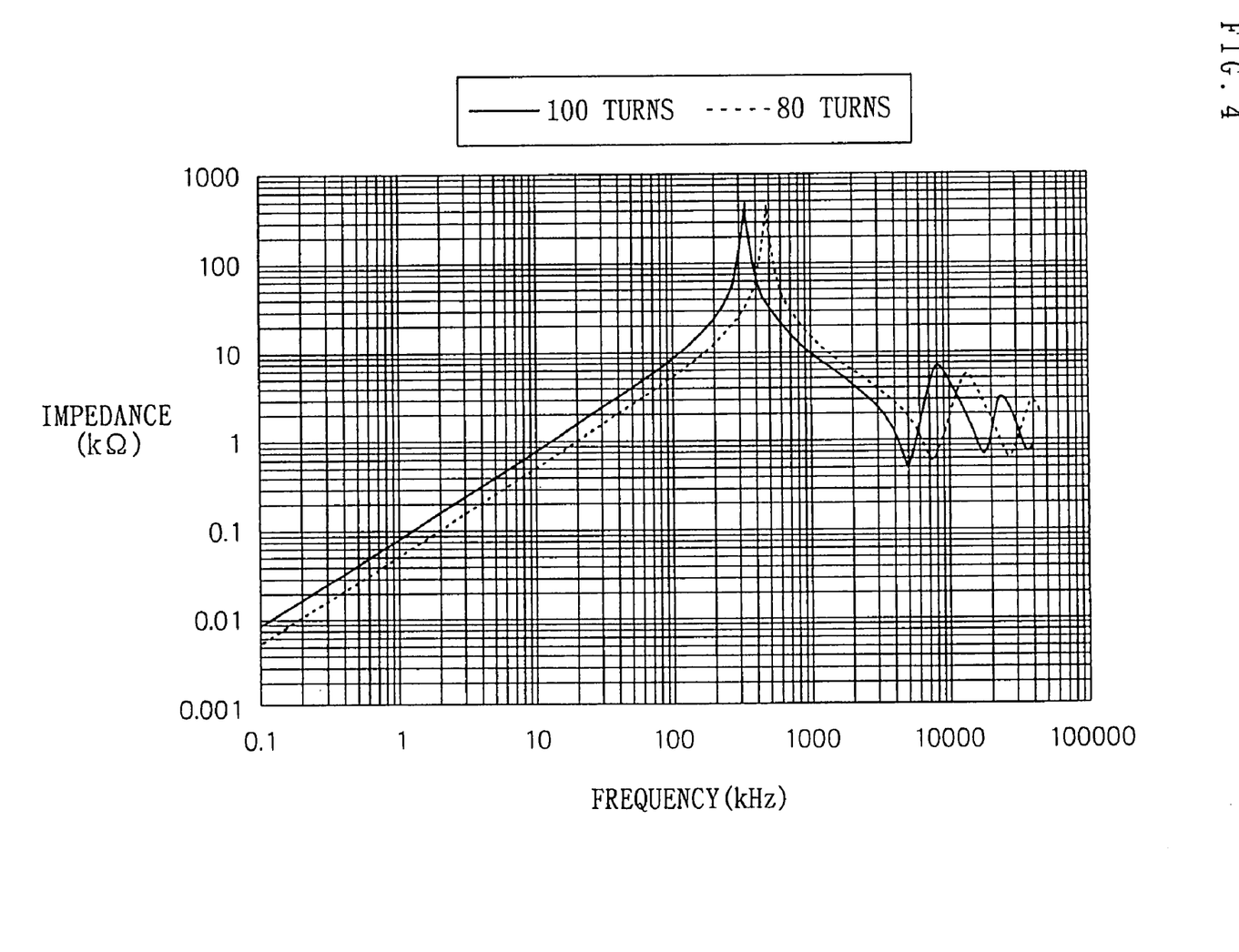
FIG. 4 is a graph showing an example of frequency-impedance characteristics of the inductor in the noise filter of FIG. 1(a)

FIG. 4 is a graph showing an example of frequency-impedance characteristics of the inductor 12. Descriptions will be given below with reference to FIG. 1 and FIG. 4.

FIG. 4 shows results in which the ferrite toroidal core is coiled with 100 turns or 80 turns so as to have the inductor 12, which is measured by an impedance analyzer. In the case of 100 turns, the impedance resonates in about 320 kHz, and in the case of 80 turns, it resonates in about 470 kHz. In the region between 1 MHz to 2 MHz, |Z| shows a characteristic curve having the shape of 1/ωC. For the frequency of 5 MHz or more, the value of |Z| shows a vibration waveform. This vibrating phenomenon of |Z| is considered to be shown since the inductor 12 is operated as a helix antenna.

Therefore, by connecting the resistor 11 in parallel with the inductor 12, an operational phenomenon as an antenna is suppressed and a high frequency noise including the commercial frequency is dissipated at the resistor 11.

Figure 5:
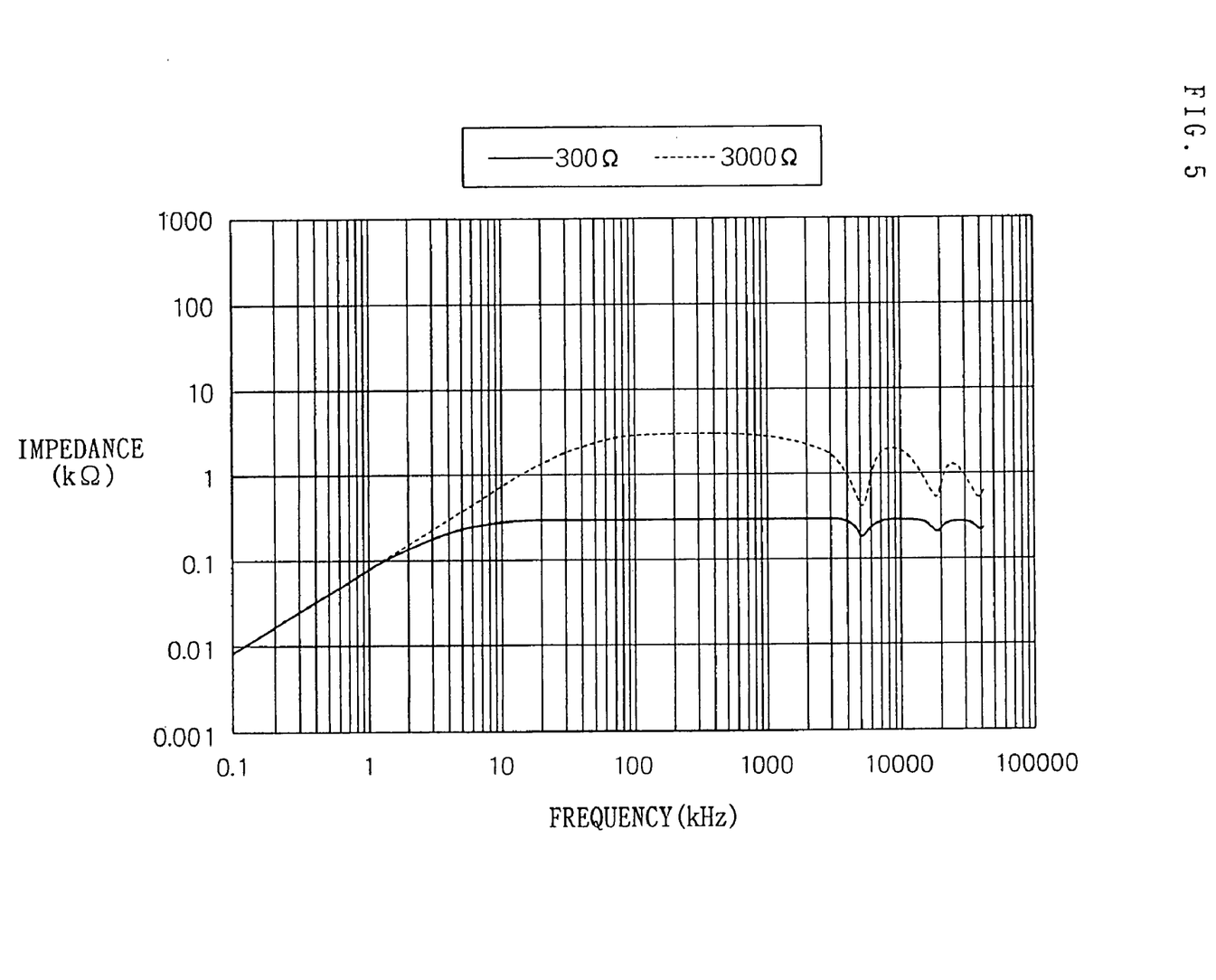
FIG. 5 is a graph showing an example of frequency-impedance characteristics of the noise filter of FIG. 1(a)

FIG. 5 shows a graph showing an example of frequency-impedance characteristics when the resistor 11 is connected in parallel with the inductor 12. Descriptions will be given below with reference to FIG. 1 and FIG. 5.

FIG. 5 shows results in which the ferrite toroidal core is coiled with 100 turns so as to have the inductor 12, which is connected to the resistor 11 of 300Ω or 3000Ω, and is measured by the impedance analyzer. As obvious from FIG. 5, the noise filter 10 is expected in its function acting as an inductance for frequency of 1 kHz or less. Against a noise frequency of 1 kHz or more, a function as a resistor increases. Further, in the phenomenon that the inductor 12 changes the impedance value to the vibration waveform in the high frequency band, the maximum value and the minimum value vary depending on the shape of the core material, fluctuations of magnetism characteristics, the wire diameter of the coil wire, the number of turns, the way of coiling, and the like. Therefore, in the noise filter 10, the resistor 11 is required in order to modify the variations of the noise reducing effect generated from the fluctuations.

Figure 6:
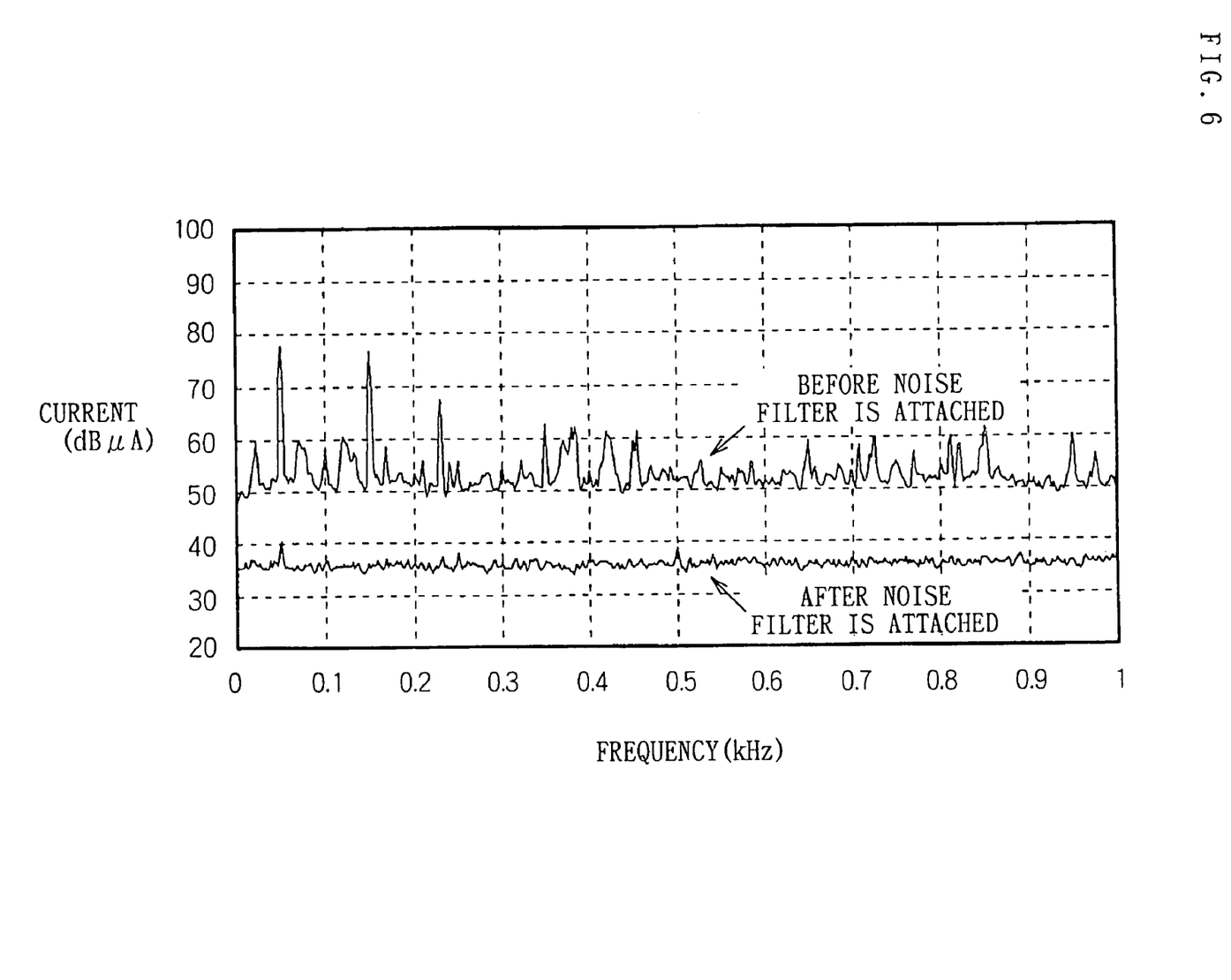
FIG. 6 is a graph showing an example of effects of the noise filter of FIG. 1(a)

FIG. 6 is a graph showing an example of the effects of the noise filter 10. Descriptions will be given below with reference to FIG. 1 and FIG. 6.

FIG. 6 shows frequency-noise current characteristics before and after the noise filter 10 is attached to a large electronic apparatus. Before the noise filter 10 is attached, the noise current In is induced in large scale on the ground line 74. When the noise filter 10 is attached, the noise current In is significantly reduced. For example, the reduction effect of 38 dB in noise current value can be recognized around the commercial frequency. This shows it works well as a noise filter.

Figure 7:
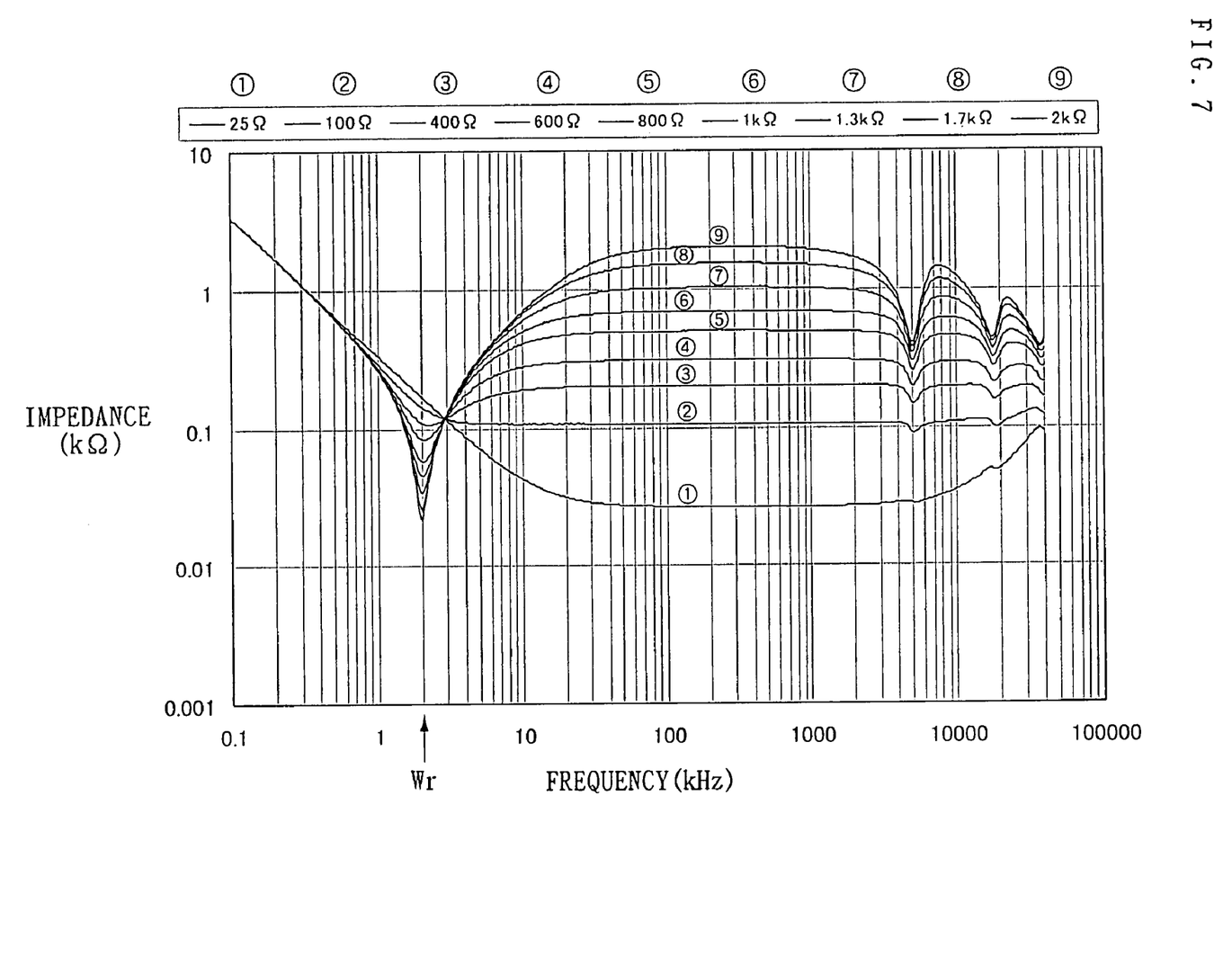
FIG. 7 is a graph showing frequency characteristics of the impedance of FIG. 1(b), measured by changing resistance of the resistor.

Next, the lower limit of the resistance R of the resistor 11 will be considered with reference to FIG. 1(b) and FIG. 7.

Assuming angular frequency of the noise current In to be W[rad], inductance of the inductor 12 to be L[H], resistance of the resistor 11 to be R[Ω], and earth capacitance of the electronic apparatus 75 is C[F], input impedance Zin of the circuit looking from the energy source side (noise source) is given as follows:

$$Zin = jR\omega L/(R+j\omega L) - j(1/\omega C) \quad (18)$$
$$= \{jR\omega^2 LC - j(R+j\omega L)\}/\{\omega C(R+j\omega L)\}$$
$$= [R\omega L(\omega^2 LC) - j\{R^2+(\omega L)^2 - R^2\omega^2 LC\}]/[\omega C\{R^2+(\omega L)^2\}]$$

Here, series resonance is generated in the proximity of the angular frequency ωr where the imaginary number in the equation (18) is 0. Therefore, assuming $$R^2+(\omega L)^2-R^2\omega^2 LC=0 \quad (19)$$

the following equation is established:

$$\omega r=1/\sqrt{(R^2 LC-L^2)} \quad (20)$$

In order to avoid a series resonance phenomenon, the equation (20) must be the imaginary number, in short, the inside of the radical sign must be $(R^2LC-L^2) \leq 0$. That is to say, the resistance of the resistor 11 must satisfy the condition of $$R \leq \sqrt{(L/C)} \qquad (21)$$

On the other hand, FIG. 7 shows a graph in which the frequency characteristic of the impedance Zin of FIG. 1(b) is measured by changing the resistance R of the resistor 11. For this measurement, an impedance analyzer is used and the conditions are so set that L=13.5 [mH], and C=0.47 [μF]. R is set to have nine values, that is, 25[Ω], 100[Ω], 400[Ω], 600[Ω], 800[Ω], 1 [kΩ], 1.3 [kΩ], 1.7 [kΩ] and 2 [kΩ].

Here, in the condition that series resonance of $R \leq \sqrt{(L/C)}$ in the equation (21) does not occur, the relationship of $R \leq 170$ is established. In FIG. 7, series resonance dose not occur in the case of 25[Ω] where this condition is satisfied. However, in the case of 400[Ω] or more, where this condition is not satisfied, a series resonance phenomenon of 2 [kHz] is recognized. As the resistance R increases, the impedance Zin of the series resonance frequency decreases, while the impedance Zin in the range of higher frequency than the series resonance frequency increases gently.

As explained above, as for R satisfying the condition of $R \leq \sqrt{(L/C)}$, series resonance is not generated but higher frequency than the resonance frequency cannot be well suppressed. To cope with this, assuming $$R > \sqrt{(L/C)} \qquad (22)$$

The condition of the formula (22) may be used with the conditions of the formula (5), (6), (7), (13) and the like.

For example, assuming the lower limit angular frequency of the noise current In to be ωn[rad], $R<2\omega n^2 L$ can be obtained form the formula (13). Combining this with the formula (22), the following relationship may be established:

$$\sqrt{(L/C)} < R < 2\omega n^2 L \text{(provided } C > 1/(4\omega n^4 L)) \qquad (23)$$

Figure 8:
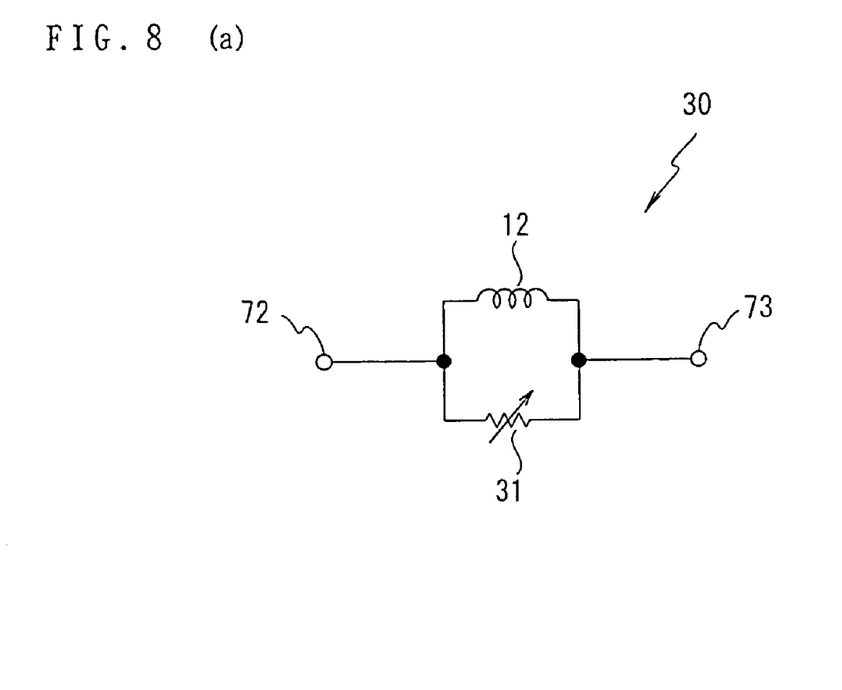
FIG. 8(a) is a circuit diagram showing a second embodiment of a noise filter according to the present invention.
FIG. 8(b) is a circuit diagram showing a third embodiment of a noise filter according to the present invention.

FIG. 8(a) is a circuit diagram showing a second embodiment of a noise filter according to the present invention. Descriptions will be given below with reference to FIG. 8(a). The same components in this Figure as those in FIG. 1(a) are indicated by the same reference numerals and their explanations are omitted.

In a noise filter 30 of this embodiment, a resistor 11 of the first embodiment (FIG. 1(a)) is a variable resistor 31. Depending on the electronic apparatuses to which the noise filter 30 is attached, the earth capacitance C fluctuates. Even in such a case, fluctuations in the resonance frequency can be accommodated properly by changing the resistance of the variable resistor 31.

FIG. 8(b) is a circuit diagram showing a third embodiment of a noise filter according to the present invention. Descriptions will be given below with reference to FIG. 8(b). The same components in this Figure as those in FIG. 8(a) are indicated by the same reference numerals and their explanations are omitted.

In a noise filter 40 of this embodiment, the variable resistor 31 of the second embodiment connects to the fixed resistor 41. Depending on the electronic apparatuses to which the noise filter 40 is attached, the earth capacitance C fluctuates. Even in such a case, fluctuations in the resonance frequency can be accommodated properly by changing the resistance of the variable resistor 31.

Figure 9:
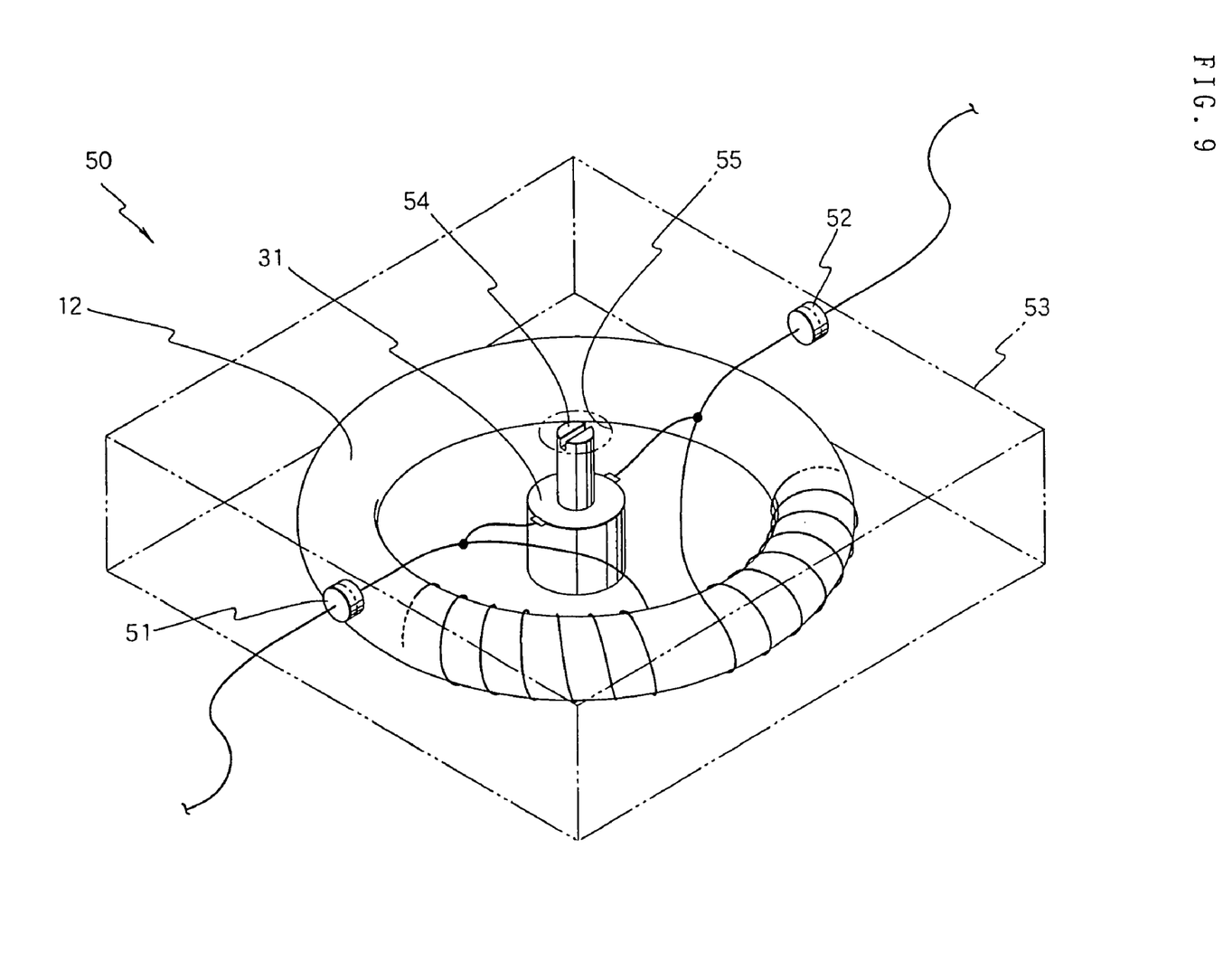
FIG. 9 is a perspective view showing a forth embodiment of a noise filter according to the present invention.

FIG. 9 is a perspective view showing a forth embodiment of a noise filter according to the present invention. Descriptions will be given below with reference to FIG. 9. Since this embodiment employs the same circuit as that of FIG. 8(a), the same components in this Figure as those in FIG. 8(a) are indicated by the same reference numerals and their explanations are omitted.

A noise filter 50 of this embodiment comprises a toroidal coil 12 as an inductor and a variable resistor 31 which are connected in parallel with each other. In the parallel circuit consisting of the toroidal coil 12 and the variable resistor 31, one terminal is grounded through a connector 51 and the other terminal connects through a connector 52 to the electronic apparatus. As such, the noise filter 50 is a two-terminal noise filter for use on a ground line. The parallel circuit consisting of the toroidal coil 12 and the variable resistor 31 is housed in a frame 53. The frame 53 is made of, for example, metal such as aluminum or conductive plastic.

Further, the variable resistor 31 is arranged at the center of the toroidal coil 12. That is, the variable resistor 31 is housed in the center space of the toroidal coil 12, so as to effectively utilize the space in the frame 53.

Further, a rotary shaft (resistance varying means) 54 for varying the resistance of the variable resistor 31 is disposed at such a position that it can be operated from the outside of the frame 53. In this configuration, by operating the rotary shaft 54 from the outside of the frame 53, fluctuations in the earth capacitance C can be easily accommodated. Specifically, since the frame 53 is provided with a through hole 55, a flathead screwdriver can be inserted from the through hole 55 so as to rotate the rotary shaft 54 easily.

Depending on the electronic apparatuses to which the noise filter 50 is attached, value of the earth capacitance C fluctuates. Therefore, by operating the rotary shaft 54 after the noise filter 50 is attached to the electronic apparatus, desired attenuation characteristics can be obtained.

What is claimed is:

1. A noise filter comprising:
   a ground line for discharging to ground a short-circuit current having an angular frequency of at least ωn radians per second and generated on an electronic apparatus a having a capacitance to ground of C farads;
   an inductor having an inductance of L henrys, for suppressing a noise current, induced on the ground line, flowing from the ground line into the electronic apparatus; and
   a resistor having a resistance of R ohms and connected in parallel with the inductor; wherein:
   $\sqrt{(L/C)} < R < 2\omega n^2 L$, and
   $C > 1/(4\omega n^4 L)$.

2. The noise filter as claimed in claim 1, wherein a power supply current has a frequency of ωp radians per second, and $10(\omega p \cdot L) < R < (\omega n \cdot L)/10$.

3. The noise filter as claimed in claim 1, wherein a power supply current has a frequency of ωp radians per second, and $100(\omega p \cdot L) < R < (\omega n \cdot L)/100$.

4. The noise filter as claimed in claim 1, wherein a power supply current has a frequency of ωp radians per second, and $1000(\omega p \cdot L) < R < (\omega n \cdot L)/1000$.

5. The noise filter as claimed in claim 1, wherein the noise filter has an impedance of 0.1 ohm or less when the short-circuit current is 25 amperes.

6. The noise filter as claimed in claim 1, wherein the reactance of the inductor is 2000 ohms or more when the frequency of the noise current is 10 kilohertz.

7. The noise filter as claimed in claim 1, wherein the resistor comprises a variable resistor.

8. The noise filter as claimed in claim 7, further comprising a frame, wherein:
   the inductor comprises a toroidal coil, the toroidal coil and the variable resistor comprise a parallel circuit housed in the frame, with the variable resistor arranged in a space surrounded by an inner peripheral wall of the toroidal coil, and the variable resistor includes a resistance varying member for varying the resistance of the variable resistor, the resistance varying member being provided at such a position as to be able to be operated from an outside of the frame.

9. An electronic apparatus comprising the noise filter as claimed in claim 1.

10. An electronic apparatus comprising the noise filter as claimed in claim 2.

11. An electronic apparatus comprising the noise filter as claimed in claim 3.

12. An electronic apparatus comprising the noise filter as claimed in claim 4.

13. An electronic apparatus comprising the noise filter as claimed in claim 5.

14. An electronic apparatus comprising the noise filter as claimed in claim 6.

15. An electronic apparatus comprising the noise filter as claimed in claim 7.

16. An electronic apparatus comprising the noise filter as claimed in claim 8.

17. An electronic apparatus comprising the noise filter as claimed in claim 9.

18. A noise filter comprising:

means for discharging to ground a short-circuit current having an angular frequency of at least $\omega n$ radians per second and generated on an electronic apparatus having a capacitance to ground of C farads;

means having an inductance of L henrys, for suppressing a noise current, induced on the ground line, flowing from the ground line into the electronic apparatus; and means having a resistance of R ohms and connected in parallel with the inductance means, wherein:

$\sqrt{(L/C)} < R < 2\omega n^2 L$, and $C > 1/(4\omega n^4 L)$.

* * * * *